United States Patent
Bell et al.

(10) Patent No.: US 11,092,655 B1
(45) Date of Patent: Aug. 17, 2021

(54) APPARATUS AND METHOD FOR TESTING ELECTRICAL WIRING OF A DEVICE

(71) Applicant: Gulfstream Aerospace Corporation, Savannah, GA (US)

(72) Inventors: Bret Bell, Savannah, GA (US); James Perdue, Savannah, GA (US); Peyton Zeagler, Savannah, GA (US); Paul Dellinger, Savannah, GA (US)

(73) Assignee: Gulfstream Aerospace Corporation, Savannah, GA (US)

( * ) Notice: Subject to any disclaimer, the term of this patent is extended or adjusted under 35 U.S.C. 154(b) by 0 days.

(21) Appl. No.: 16/837,740

(22) Filed: Apr. 1, 2020

(51) Int. Cl.
*G01R 31/58* (2020.01)
*G01R 31/56* (2020.01)
*G01R 31/50* (2020.01)
*G01R 31/08* (2020.01)
*H01R 105/00* (2006.01)
*H01R 24/66* (2011.01)

(52) U.S. Cl.
CPC ........... *G01R 31/58* (2020.01); *G01R 31/085* (2013.01); *G01R 31/50* (2020.01); *G01R 31/56* (2020.01); *H01R 24/66* (2013.01); *H01R 2105/00* (2013.01)

(58) Field of Classification Search
CPC ...... G01R 31/00; G01R 31/01; G01R 31/013; G01R 31/08; G01R 31/081; G01R 31/085; G01R 31/086; G01R 31/50; G01R 31/52; G01R 31/58
See application file for complete search history.

(56) References Cited

U.S. PATENT DOCUMENTS

| | | | | |
|---|---|---|---|---|
| 8,519,660 | B1* | 8/2013 | Ledbetter | H02B 1/36 318/671 |
| 2003/0128507 | A1* | 7/2003 | Metcalf | G06F 1/266 361/679.21 |
| 2011/0068801 | A1* | 3/2011 | Lenzie | G01R 31/50 324/508 |
| 2017/0104325 | A1* | 4/2017 | Eriksen | H02H 3/00 |
| 2020/0328586 | A1* | 10/2020 | Eriksen | H02H 7/226 |

* cited by examiner

*Primary Examiner* — Van T Trieu
(74) *Attorney, Agent, or Firm* — LKGlobal | Lorenz & Kopf, LLP

(57) ABSTRACT

Apparatuses and methods for testing electrical wiring of a device are provided. In one example, the device has a conductive portion, an electrical component, and a multiphase plug that is electrically coupled to a neutral conductor and at least two phase conductors. The neutral conductor is coupled to the conductive portion and the at least two phase conductors are coupled to the electrical component. The apparatus includes a receptacle that removably couples to the multiphase plug. A grounding cable removably couples to the conductive portion. A power supply generates power and is in electrical communication with the receptacle to communicate the power to the receptacle. An annunciator is in electrical communication with the power supply and the grounding cable and is configured to generate a response when the receptacle, the multiphase plug, the conductive portion, and the grounding cable are in electrical communication to communicate the power therethrough.

20 Claims, 5 Drawing Sheets

APPARATUS AND METHOD FOR TESTING ELECTRICAL WIRING OF A DEVICE

TECHNICAL FIELD

The technical field relates generally to testing electrical wiring of a device, and more particularly, relates to apparatuses and methods for testing electrical wiring of a device having a multiphase plug that is electrically coupled to a neutral conductor and at least two phase conductors.

BACKGROUND

Multiphase electrical wiring such as, for example, 3-phase wiring is commonly used in devices that require large amounts of power as these wiring systems can efficiently and economically transmit power to such devices. 3-phase wiring includes 3 phase conductors that electrically couple to a power supply and a grounding or neutral conductor that is typically connected to the chassis or body of the device.

The device may include, for example, a large motor, a pump, and/or a hydraulic rig that requires large amounts of power to operate a heavy load. In many cases, the device chassis includes a conductive portion(s) (e.g., metal body or the like) that allows the grounding conductor to dissipate electrical charge to the device chassis as a precautionary safety measure. In contrast, the phase conductors, which are wired to carry electrical power, are typically electrically coupled to an electrical component(s) of the device to transmit power to drive the component(s) such as, for example, a motor, a pump, and/or the like.

Unfortunately, there have been instances when one of the active phase conductor(s) and grounding or neutral conductor have been swapped and/or otherwise incorrectly wired, for example, during maintenance, refurbishing, repair, or the like of the device and/or its corresponding electrical wiring. This can result in one of the conductors that carries electrical power being connected to the chassis of the device, creating a safety concern when the device is powered, potentially resulting in damage to the device or injury to persons around it.

Accordingly, it is desirable to provide apparatuses and methods for testing electrical wiring of a device that alleviate any miswiring concerns. Furthermore, other desirable features and characteristics of the various embodiments described herein will become apparent from the subsequent detailed description and the appended claims, taken in conjunction with the accompanying drawings and this background.

SUMMARY

Various non-limiting embodiments of an apparatus for testing electrical wiring of a device and a method for testing electrical wiring of a device are provided herein. The device has a conductive portion, an electrical component, and a multiphase plug that is electrically coupled to a neutral conductor and at least two phase conductors. The neutral conductor is coupled to the conductive portion and the at least two phase conductors are coupled to the electrical component.

In a first non-limiting embodiment, the apparatus includes, but is not limited to, a receptacle that removably couples to the multiphase plug. The apparatus further includes, but is not limited to, a grounding cable that removably couples to the conductive portion. The apparatus further includes, but is not limited to, a power supply that is configured to generate power and that is in electrical communication with the receptacle to communicate the power to the receptacle. The apparatus further includes, but is not limited to, an annunciator that is in electrical communication with the power supply and the grounding cable and that is configured to generate a response when the receptacle, the multiphase plug, the conductive portion, and the grounding cable are in electrical communication to communicate the power therethrough.

In another non-limiting embodiment, the apparatus includes, but is not limited to, a receptacle that includes a ground outlet and active outlets. The ground outlet removably couples to a ground terminal of the multiphase plug and the active outlets removably couple to active terminals of the multiphase plug. The neutral conductor is electrically coupled to the ground terminal or one of the active terminals. The apparatus further includes, but is not limited to, a grounding cable that removably couples to the conductive portion. The apparatus further includes, but is not limited to, a first circuit section. The first circuit section includes a first power supply that is configured to generate a first power and that is in electrical communication with the receptacle to communicate the first power to the ground outlet. The first circuit section further includes a first annunciator that is in electrical communication with the first power supply and the grounding cable and that is configured to generate a first response when the ground outlet, the ground terminal, the neutral conductor, the conductive portion, and the grounding cable are in electrical communication to communicate the first power therethrough. The apparatus further includes, but is not limited to, a second circuit section. The second circuit section includes a second power supply that is configured to generate a second power and that is in electrical communication with the receptacle to communicate the second power to the active terminals. The second circuit section further includes a second annunciator that is in electrical communication with the second power supply and the grounding cable and that is configured to generate a second response when one of the active outlets, a corresponding one of the active terminals, the neutral conductor, the conductive portion, and the grounding cable are in electrical communication to communicate the second power therethrough.

In another non-limiting embodiment, the method includes, but is not limited to, removably coupling a receptacle to the multiphase plug. The receptacle is electrically coupled to a power supply that is electrically couples to an annunciator. The method further includes, but is not limited to, removably coupling a grounding cable to the conductive portion. The grounding cable is electrically coupled to the annunciator. The method further includes, but is not limited to, communicating power from the power supply to the receptacle. The method further includes, but is not limited to, generating a response from the annunciator when the receptacle, the multiphase plug, the conductive portion, and the grounding cable are in electrical communication to communicate the power therethrough.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to apparatuses for testing electrical wiring of a device and methods for testing electrical wiring of a device. The device has a conductive portion (e.g., metal or conductive chassis, housing or body portion of the device), an electrical component (e.g., a motor, a pump), and a multiphase plug that is electrically coupled to a neutral conductor (e.g., wire intended for grounding) and at least two phase conductors (e.g., wires intended to carry electrical power). The neutral conductor is coupled to the conductive portion and the at least two phase conductors are coupled to the electrical component. In an exemplary embodiment, the conductive portion is electrically isolated from the electrical component.

In an exemplary embodiment, the apparatus includes a receptacle, a grounding cable, a power supply, and an annunciator. The receptacle removably couples to the multiphase plug and the grounding cable removably couples to the conductive portion of the device. The power supply (e.g., relatively low voltage direct current (D.C.) battery) is configured to generate power and is in electrical communication with the receptacle to communicate the power to the receptacle. The annunciator is in electrical communication with the power supply and the grounding cable and is configured to generate a response (e.g., light, sound, other alert) when the receptacle, the multiphase plug, the conductive portion, and the grounding cable are in electrical communication to communicate the power therethrough.

In an exemplary embodiment, by configuring the apparatus such that the annunciator generates a response when the power from the power supply is communicated through the receptacle, the multiphase plug, the conductive portion, and the grounding cable, advantageously the response from the annunciator identifies whether the electrical wiring of the device is properly or improperly wired. As such, a mechanic or other operator of the apparatus can efficiently determine if the device has been properly wired, for example, during or after maintenance, refurbishing, repair, or the like of the device without having to power the device for operation and potentially charging the conductive portion of the device in the event that the device has been improperly wired and thereby creating a safety issue.

Figure 1:
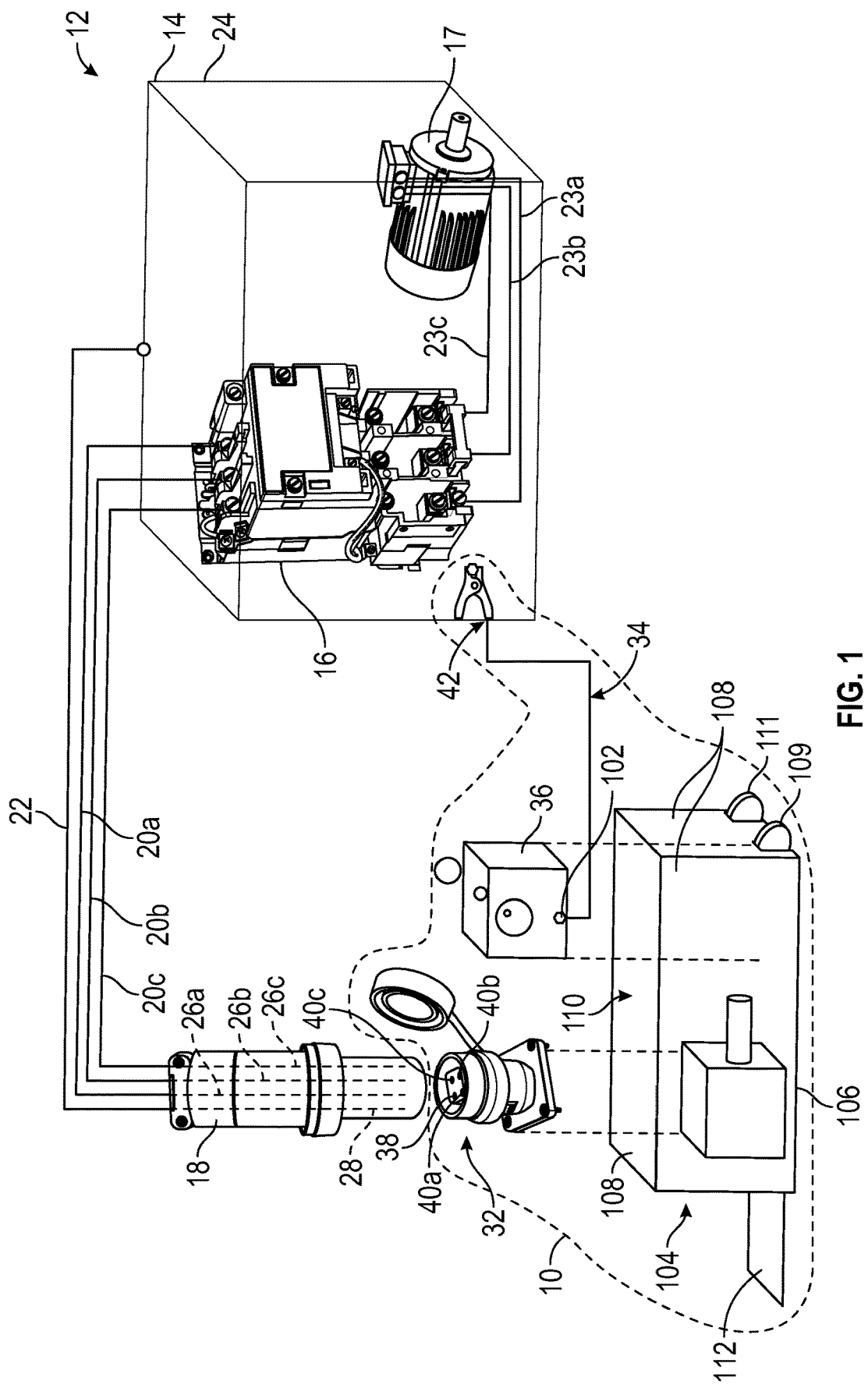
FIG. 1 illustrates a partially exploded view of an apparatus that is testing electrical wiring of a correctly wired device in accordance with an exemplary embodiment.
Figure 2:
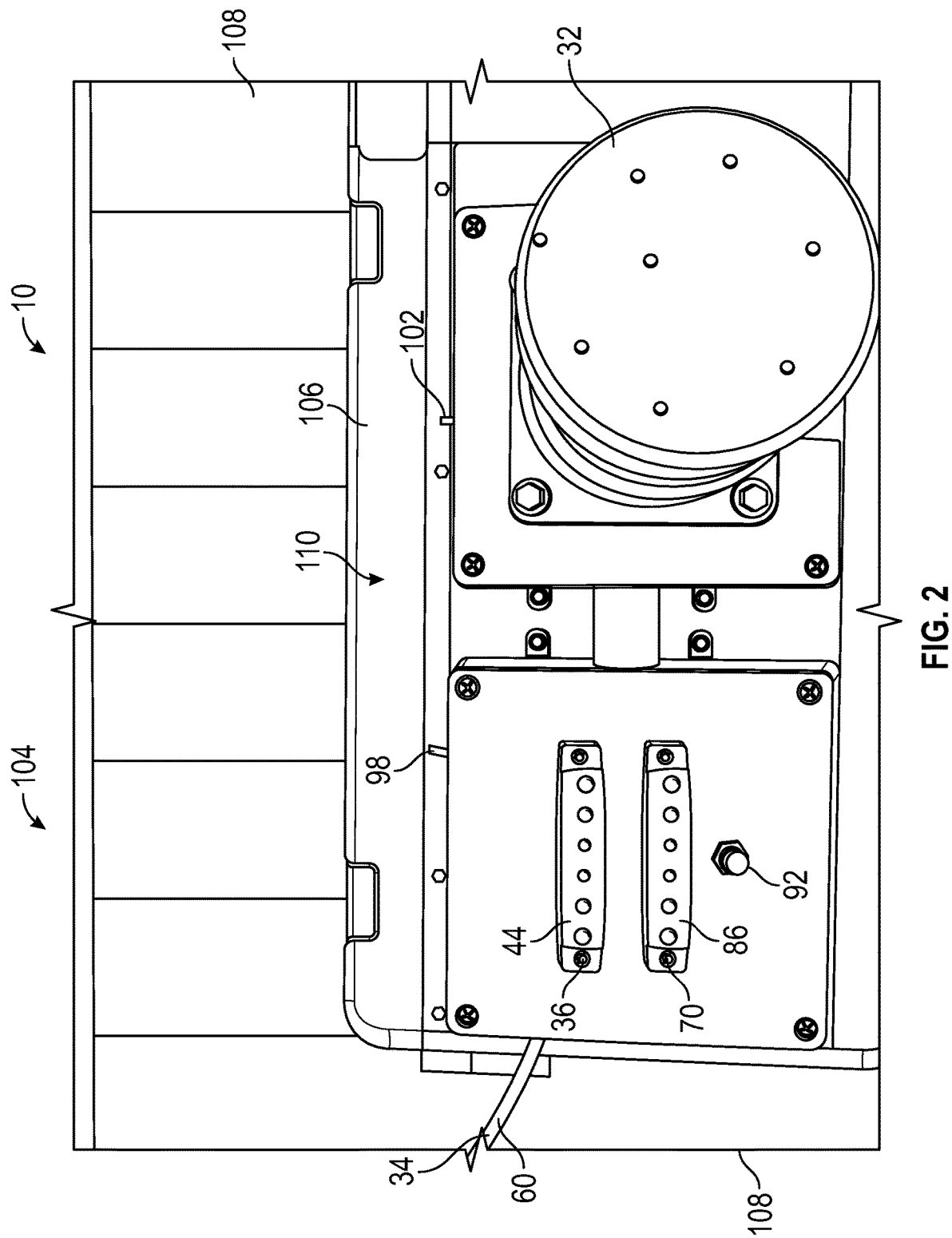
FIG. 2 illustrates a top view of a portion of the apparatus in accordance with an exemplary embodiment.
Figure 3:
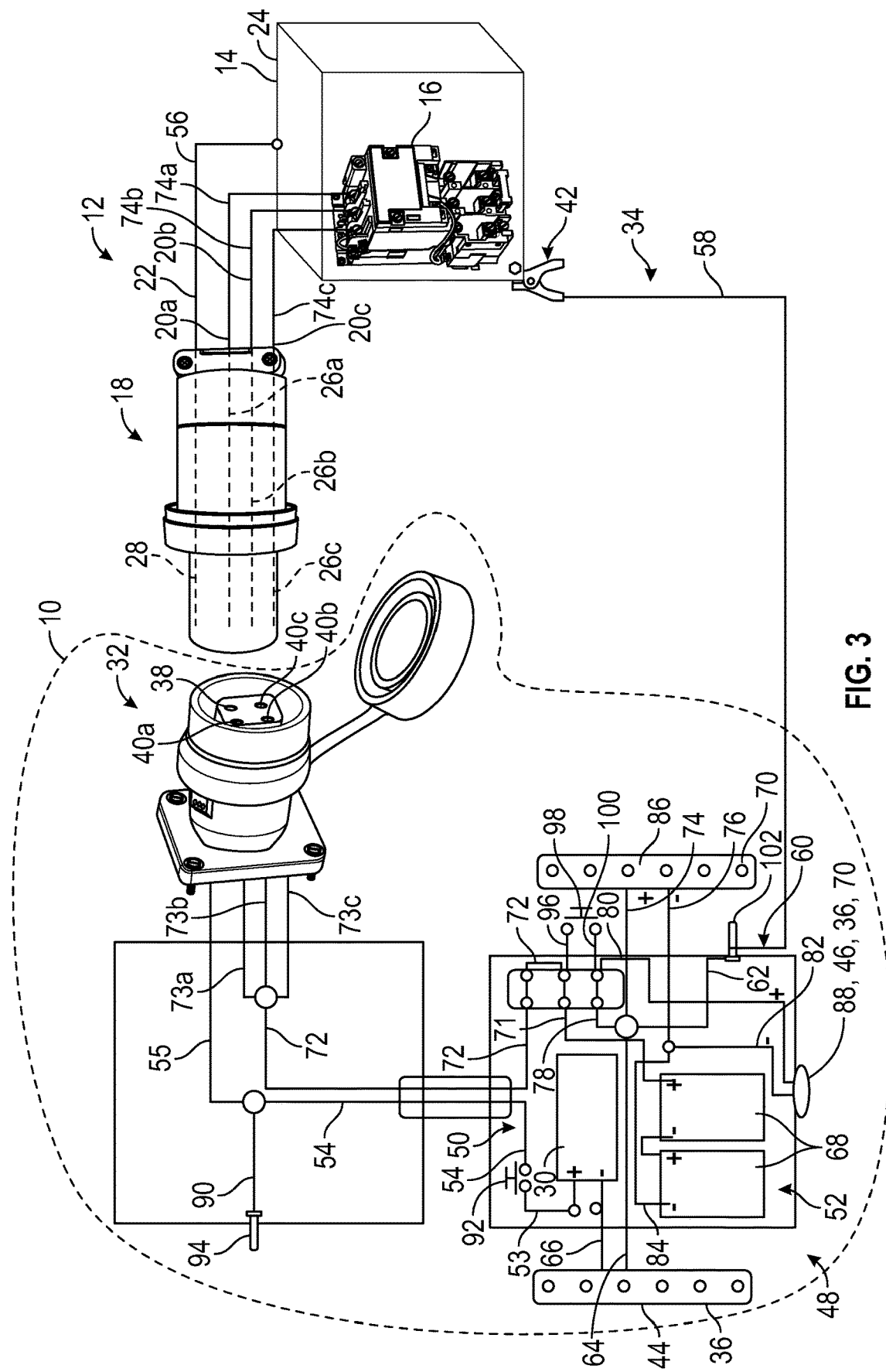
FIG. 3 illustrates a schematic representation of an apparatus and a correctly wired device in accordance with an exemplary embodiment.

FIGS. 1-3 illustrate an apparatus 10 that is being used to test electrical wiring of a device 12 and FIGS. 1 and 3 additionally illustrate the device 12 as correctly or properly wired in accordance with exemplary embodiments. The device 12 includes a conductive portion 14, one or more electrical components 16 and 17, a multiphase plug 18, phase conductors 20a, 20b, and 20c (e.g., wires intended for carrying electrical power), and a neutral conductor 22 (e.g., a wire intended for grounding). Although the device 12 is illustrated as having three phase conductors 20a, 20b, and 20c, it is to be understood that various embodiments of the device 12 include the device 12 having two phase conductors, or more than three phase conductors.

As illustrated, the conductive portion 14 is a conductive housing or chassis 24 that houses, supports, or otherwise at least partially surrounds the electrical components 16 and 17. The conductive portion 14 may be formed of or otherwise include a conductive material, such as, for example, steel, aluminum, copper, other conductive metal, or the like. Alternatively, the conductive portion 14 may be coupled to and/or form a part of the chassis 24 or be configured as another body portion or the like of the device 12.

The multiphase plug 18 is electrically coupled to each of the phase conductors 20a, 20b, and 20c and the neutral conductor 22. In an exemplary embodiment, the multiphase plug is a 3-phase plug. As illustrated, the phase conductors 20a, 20b, and 20c are each coupled to the electrical component 16 and the neutral conductor 22 is coupled to the conductive portion 14. In an exemplary embodiment and as will be discussed in further detail below, the electrical components 16 and 17 are electrically isolated from the conductive portion 14.

In an exemplary embodiment, the multiphase plug 18 includes active terminals 26a, 26b, and 26c and a ground terminal 28. As illustrated, when the device 12 is correctly wired, for example, each of the active terminals 26a, 26b, and 26c are electrically coupled to a corresponding phase conductor 20a, 20b, or 20c, and the ground terminal 28 is electrically coupled to the corresponding neutral conductor 22. Alternatively and as will be discussed in further detail below, if the device 12 is incorrectly wired, then one of the active terminals 26a, 26b, or 26c is electrically coupled to the neutral conductor 22, and the other active terminal(s) 26a, 26b, and/or 26c and the ground terminal 28 are each electrically coupled to a corresponding phase conductor 20a, 20b, or 20c.

In an exemplary embodiment, the device 12 is configured as a hydraulic rig for pumping fluid between a vehicle (e.g., aircraft or other vehicle) and the hydraulic rig. As illustrated, the electrical components 16 and 17 are respectively configured as a motor starter and a pump motor that is in electrical communication with the motor starter via wires 23a, 23b, and 23c. In an exemplary embodiment, during normal operation of the device 12, the multiphase plug 18 is plugged into or otherwise electrically coupled to an external relatively high voltage, alternating current (A.C.) power supply (not illustrated). Power supplied to the multiphase plug 18 is carried by the phase conductors 20a-c to the motor starter 16 and from the motor starter 16 to the pump motor 17 by wires 23a-c to drive the pump motor 17 to pump fluid. In an exemplary embodiment, the electrical components 16 and 17 are electrically isolated from the conductive portion 14 (e.g., chassis 24) of the device 12 unless one or both of the electrical components 16 and 17 and/or any of the wiring unintentionally shorts out to the conductive portion 14, which is grounded via the neutral conductor 22 for safety.

With continued reference to FIGS. 1-3, in an exemplary embodiment, when the device 12 is not in use during normal operation (e.g., for pumping fluid) and a mechanic or other personnel wants to confirm that the electrical wiring of the device 12 is correct or otherwise, for example during or after maintenance, refurbishing, repair, or the like of the device 12, the apparatus 10 is used to test the electrical wiring. The apparatus 10 includes a power supply 30 (e.g., a relatively low voltage power supply), a receptacle 32, a grounding cable 34, and an annunciator 36. The power supply 30 is configured to generate power and is in electrical communication with the receptacle 32 to communicate the power to the receptacle 32. In an exemplary embodiment, the power generated by the power supply 30 is a relatively low voltage, direct current (DC) power.

The receptacle 32 receives or otherwise removably couples to the multiphase plug 18. In an exemplary embodiment, the receptacle 32 includes a ground outlet 38 and active outlets 40a, 40b, and 40c. The ground outlet 38 receives or removably couples to the ground terminal 28 and each of the active outlets 40a, 40b, and 40c receives or removably couples to a corresponding active terminal 26a, 26b, or 26c.

The grounding cable 34 removably couples to the conductive portion 14 of the device 12. For example, the conductive portion 14 may include a component such as a bolt, a screw, or the like, and the grounding cable 34 removably couples to this component. In an exemplary embodiment, the grounding cable 34 has an end portion 42 that removably couples to the conductive portion 14. In an exemplary embodiment, the end portion 42 is a clamp or the like that is spring-loaded and clamps onto the conductive portion 14.

In an exemplary embodiment, the annunciator 36 is an alert device and is in electrical communication with the power supply 30 and the grounding cable 34. As will be discussed in further detail below, the annunciator 36 is configured to generate a response when the receptacle 32, the multiphase plug 18, the conductive portion 14, and the grounding cable 34 are in electrical communication to communicate the power therethrough. In an exemplary embodiment, the annunciator 36 generates the response as a humanly perceivable response that includes light and/or sound for alerting the mechanic and/or other personnel a condition(s) with respect to the wiring of the device 12. In an exemplary embodiment, the annunciator 36 includes a light source 44 that generates light (e.g., an alert flash, flashing or constant light) as at least part of the response. In one example, the light source 44 is a light-emitting diode (LED) light source (e.g., a single LED or an array of LEDs). Alternatively, or in addition to the light source 44, the annunciator 36 may include a sound source 46 (e.g., speaker or the like) that generates sound (e.g., an alert noise, buzzing sound) as at least part of the response.

The apparatus 10 includes a circuit 48 that has circuit sections 50 and 52. In an exemplary embodiment, during testing of the electrical wiring of the device 12 with the apparatus 10, the circuit section 50 is configured to generate a response when the device 12 is correctly wired while the circuit section 52 is configured to generate a response when the device 12 is incorrectly wired.

The circuit section 50 includes the power supply 30, the annunciator 36, and lines 53, 54, 55, 62, 64, and 66 (e.g., wires, conductive lines). The power supply 30 is in electrical communication with the receptacle 32 to communicate the power from the circuit section 50 to the ground outlet 38 via lines 53, 54, and 55. When the multiphase plug 18 is plugged into the receptacle 32, the power is communicated from the ground outlet 38 to the ground terminal 28. As illustrated in FIG. 3, the device 12 is correctly wired with the ground terminal 28 electrically coupled to the corresponding neutral conductor 22, which is coupled to the conductive portion 14. As such, the power is communicated from the ground terminal 28 through the neutral conductor 22 to the conductive portion 14 via line 56 (e.g., wire, conductive line). When the grounding cable 34 is clamped or otherwise removably coupled to the conductive portion 14, the power is communicated from the conductive portion 14 to the grounding cable 34. In an exemplary embodiment, the grounding cable 34 includes line 58 (e.g., wire, conductive line) that extends from the end portion 42 (e.g., clamp) to an end portion 60 that is electrically coupled to the circuit 48. As such, the power is communicated through the grounding cable 34 to the circuit 48 via line 58, and to the annunciator 36 of the circuit section 50 via lines 62 and 64. When the annunciator 36 receives the power, the annunciator 36 generates the response as discussed above to alert the mechanic or other personnel that the device 12 is correctly wired. In an exemplary embodiment, the response from the annunciator 36 is a green light(s) indicating that the device 12 is properly wired. As illustrated, the annunciator 36 is electrically coupled to the power supply 30 via line 66 to form a complete circuit. In an exemplary embodiment, the annunciator 36 generates the response when the ground outlet 38, the ground terminal 28, the neutral conductor 22, the conductive portion 14, and the grounding cable 34 are in electrical communication to communicate the power therethrough. In an exemplary embodiment, by generating the response, the annunciator 36 indicates that the electrical wiring of the device 12 is correctly wired.

The circuit section 52 includes a power supply 68, an annunciator 70, and lines 71, 72, 73a, 73b, 73c, 62, 74, 76, 78, 80, 82, and 84 (e.g., wires, conductive lines). In an exemplary embodiment, the power supply 68 includes batteries wired in series. In an exemplary embodiment, the power generated by the power supply 68 is a direct current (DC) power. The power supply 68 is configured to generate power and is in electrical communication with the receptacle 32 to communicate the power from the circuit section 52 to each of the active outlets 40a, 40b, and 40c via line 71 through line 72 to and through lines 73a, 73b, and 73c. As illustrated in FIG. 3, the device 12 is properly or correctly wired. As discussed above, this means that each active terminal 26a, 26b, and 26c is electrically coupled to a corresponding phase conductor 20a, 20b, or 20c. As such, the power is communicated from the active terminals 26a, 26b, and 26c through the phase conductors 20a, 20b, and 20c to the electrical component 16 via lines 74a, 74b, and 74c. The electrical component 16 is electrically isolated from the conductive portion 14, and therefore the power is prevented from being communicated to the conductive portion 14. Accordingly, the power is prevented from being communicated to the grounding cable 34 and the annunciator 70 fails to generate a response. In an exemplary embodiment, by failing to generate the response, the annunciator 70 indicates that the device 12 is not incorrectly wired.

Figure 4:
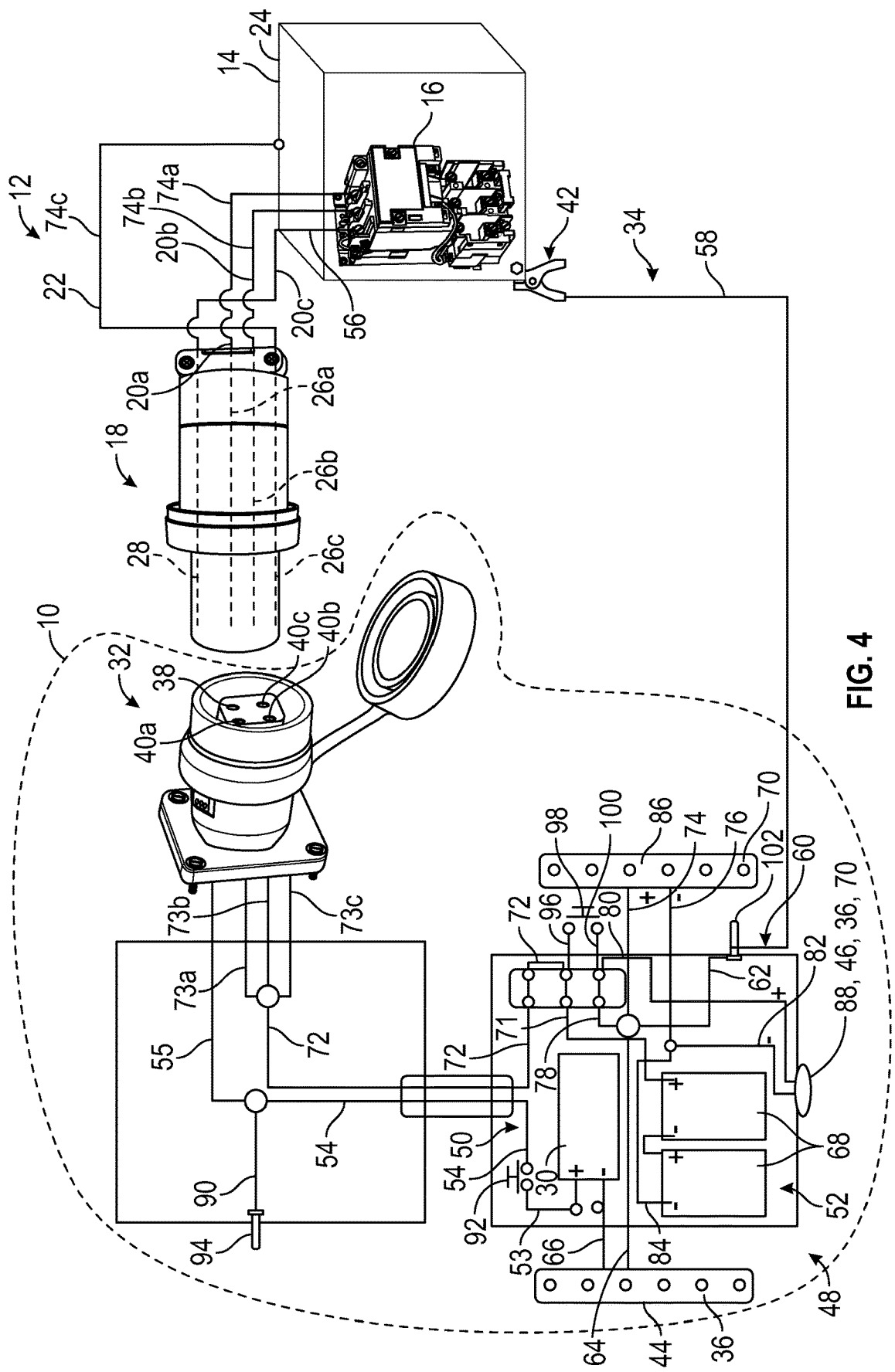
FIG. 4 illustrates a schematic representation of an apparatus and an incorrectly wired device in accordance with an exemplary embodiment.

Referring to FIG. 4, a schematic representation of the apparatus 10 and the device 12 improperly or incorrectly wired in accordance with an exemplary embodiment is provided. With respect to circuit section 50, the power supply 30 is in electrical communication with the receptacle 32 to communicate the power from the circuit section 50 to the ground outlet 38 via lines 53, 54, and 55. When the multiphase plug 18 is plugged into the receptacle 32, the power is communicated from the ground outlet 38 to the ground terminal 28. As illustrated in FIG. 4, the device 12 is incorrectly wired with the ground terminal 28 electrically coupled to one of the corresponding phase conductors 20a, 20b, or 20c. As such, the power is communicated from the ground terminal 28 through one of the phase conductors 20a, 20b, or 20c to the electrical component 16 via line 56. The electrical component 16 is electrically isolated from the conductive portion 14, and therefore the power is not communicated to the conductive portion 14, the grounding cable 34, and the annunciator 36, which remains unresponsive. In an exemplary embodiment, by failing to generate the response, the annunciator 36 indicates that the device 12 is not correctly wired.

With respect to circuit section 52, the power supply 68 is in electrical communication with the receptacle 32 to communicate the power from the circuit section 52 to the active outlets 40a, 40b, and 40c via lines 71, 72, 73a, 73b, and 73c. When the multiphase plug 18 is plugged into the receptacle 32, the power is communicated from the active outlets 40a, 40b, and 40c to the active terminals 26a, 26b, and 26c. As illustrated in FIG. 4, the device 12 is incorrectly wired. As discussed above, this means that one of the active terminals 26a, 26b, or 26c is electrically coupled to the neutral conductor 22. As such, the power is communicated from one of the active terminals 26a, 26b, or 26c through the neutral conductor 22 to the conductive portion 14 via line 74c. When the grounding cable 34 is clamped or otherwise removably coupled to the conductive portion 14, the power is communicated from the conductive portion 14 to the grounding cable 34. The power is then communicated from the grounding cable 34 to the circuit section 52 via line 58. In an exemplary embodiment, the annunciator 70 includes a light source 86 that is configured to generate light and a sound source 88 that is configured to generate sound. From the end portion 60 of the grounding cable 34, the power is communicated to the light source 86 via lines 62 and 74 and the power is also communicated to the sound source 88 via lines 62, 78, and 80. When the annunciator 70 receives the power, the annunciator 70 generates the response. For example, when the power is communicated to the light source 86, the light source generates light. Likewise, when the power is communicated to the sound source 88, the sound source generates sound. In an exemplary embodiment, the response from the annunciator 70 includes a red light generated by the light source 86 and a sound generated by the sound source 88. From the light source 86, the power is communicated to the power supply 68 via lines 76, and 84 to complete the circuit. Likewise, from the sound source 88, the power is communicated to the power supply 68 via lines 82 and 84 to complete the circuit. In an exemplary embodiment, the annunciator 70 is configured to generate the response when one of the active outlets 40a, 40b, or 40c, one of the active terminals 26a, 26b, or 26c, the neutral conductor 22, the conductive portion 14, and the grounding cable 34 are in electrical communication to communicate the power therethrough. In an exemplary embodiment, by generating the response, the annunciator 70 indicates that the electrical wiring of the device 12 is incorrectly wired.

In an exemplary embodiment, the circuit section 50 is configured to generate an additional response when the power supply 30 generates power. As illustrated, the circuit section 50 further includes line 90 and an actuator 92. In an exemplary embodiment, the actuator 92 is a switch, a button, or the like. The actuator 92 moves between a first position and a second position (e.g., on-off positions or vice versa). When the actuator 92 is in the first position, it prevents power that is generated by the power supply 30 from being communicated from line 53 to line 54. As such, when the actuator 92 is in the first position, power is prevented from being communicated from the power supply 30 to the ground outlet 38. When the actuator 92 is in the second position, it allows power that is generated by the power supply 30 to pass from line 53 to line 54. As such, when the actuator 92 is in the second position, power is allowed to be communicated from the power supply 30 to the ground outlet 38.

In an exemplary embodiment, the apparatus 10 includes a conductive terminal 94. The end portion 42 of the grounding cable 34 is configured to be clamped or otherwise removably couple to the conductive terminal 94 when electrically isolated from (e.g., not clamped to) the conductive portion 14. When the end portion 42 of the grounding cable 34 is removably coupled to the conductive terminal 94, the power supply 30 communicates the power from the circuit section 50 to the conductive terminal 94 via lines 53, 54, and 90. The power is then communicated from the conductive terminal 94 to the end portion 42 of the grounding cable 34 back to the circuit section 50 via line 58. Then, the power is communicated from the end portion 60 to the annunciator 36 via lines 62 and 64. When the power is communicated to the annunciator 36, the annunciator 36 generates an additional response. In an exemplary embodiment, the additional response from the annunciator 36 is green light. The power then is communicated from the annunciator 36 to the power supply 30 via line 66 to complete the circuit. In an exemplary embodiment, the annunciator 36 is configured to generate the additional response when the end portion 42 of the grounding cable 34 is coupled to the conductive terminal 94 to indicate that the power supply 30 is generating power.

In an exemplary embodiment, the circuit section 52 is configured to generate an additional response when the power supply 68 generates power. As illustrated, the circuit section 52 further includes lines 96 and 100 and an actuator 98. The actuator 98 moves between a first position and a second position (e.g., on-off positions or vice versa). When the actuator 98 is in the first position, it allows power that is generated by the power supply 68 to be communicated from line 71 to line 72 and prevents the power from being communicated from line 96 to line 100. As such, when the actuator 98 is in the first position, power is allowed to be communicated from the power supply 68 to the active outlets 40. When the actuator 98 is in the second position, it allows power that is generated by the power supply 68 to be communicated from line 96 to line 100 and prevents the power from being communicated from line 71 to line 72. As such, when the actuator 98 is in the second position, power is prevented from being communicated from the power supply 68 to the active outlets 40a, 40b, and 40c.

In an exemplary embodiment, the apparatus 10 includes a ground cable terminal 102 that is coupled to the end portion 60 of the ground cable 34. The end portion 42 of the grounding cable 34 is configured to removably couple (e.g., clamp) to the ground cable terminal 102 when electrically isolated from (e.g., not clamped to) the conductive portion 14. When the end portion 42 is removably coupled to the ground cable terminal 102 and the actuator 98 is in the second position, the power supply 68 communicates the power from the power supply 68 to the sound source 88 of the annunciator 70 via lines 71, 96, 100, and 80. When the end portion 42 is removably coupled to the ground cable terminal 102 and the actuator 98 is in the second position, the power from the power supply 68 is also communicated to the light source 86 of the annunciator 70 via lines 71, 96, 100, 78, and 74. When the power is communicated to the annunciator 70, the annunciator 70 generates the additional response. In an exemplary embodiment, the additional response from the annunciator 70 is red light generated by the light source 86 and sound generated by the sound source 88. The power is then communicated from the light source 86 to the power supply 68 via lines 876 and 84 to complete the circuit. Likewise, the power is communicated from the sound source 88 to the power supply 68 via lines 82 and 84 to complete the circuit. In an exemplary embodiment, the annunciator 70 is configured to generate the additional response when the end portion 42 is coupled to the ground cable terminal 102 to indicate that the power supply 68 is generating power.

Referring again to FIGS. 1 and 2, in an exemplary embodiment, the apparatus 10 includes a container 104. The container 104 has a base portion 106 and walls 108 extending therefrom to at least partially surround a cavity 110. In an exemplary embodiment, the receptacle 32, the grounding cable 34, the power supply 30, the power supply 68, the annunciator 36, and the annunciator 70 are disposed in the cavity 110. The container 104 is manually portable. For example, the container 104 may include a plurality of wheels 109 and 111 coupled to the base portion 106 and a handle 112 coupled to one of the walls 108.

Figure 5:
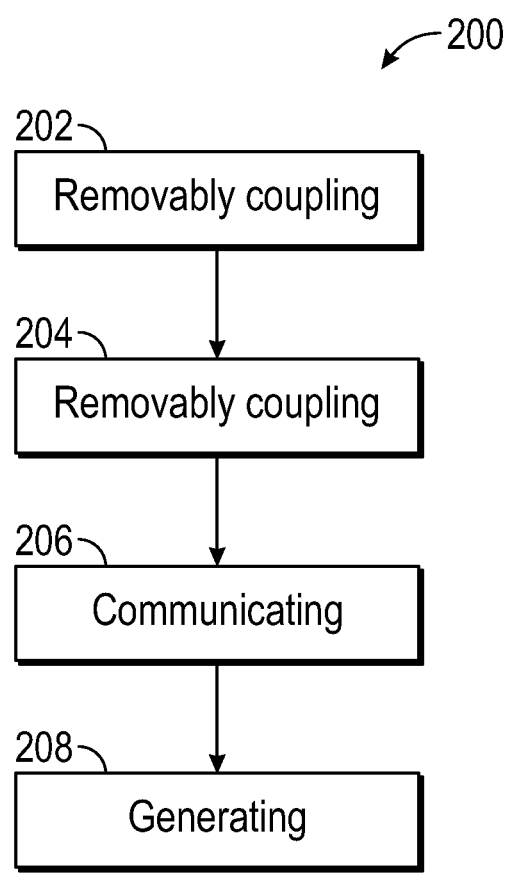
FIG. 5 illustrates a block diagram for a method for testing electrical wiring of a device in accordance with an exemplary embodiment.

FIG. 5 illustrates a method 200 for testing electrical wiring of a device in accordance with an exemplary embodiment. The device has a conductive portion, an electrical component, and a multiphase plug that includes a ground terminal and active terminals and that is electrically coupled to a neutral conductor and at least two phase conductors. The neutral conductor is coupled to the conductive portion and the at least two phase conductors are coupled to the electrical component.

The method includes removably coupling (STEP 202) a receptacle to the multiphase plug. The receptacle is electrically coupled to an annunciator. A grounding cable is removably coupled (STEP 204) to the conductive portion. The grounding cable is electrically coupled to the annunciator. Power from the power supply is communicated (STEP 206) to the receptacle. A response is generated (STEP 208) from the annunciator when the receptacle, the multiphase plug, the conductive portion, and the grounding cable are in electrical communication to communicate the power therethrough.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. An apparatus for testing electrical wiring of a device having a conductive portion, an electrical component, and a multiphase plug that is electrically coupled to a neutral conductor and at least two phase conductors, wherein the neutral conductor is coupled to the conductive portion and the at least two phase conductors are coupled to the electrical component, the apparatus comprising:
   a receptacle that removably couples to the multiphase plug;
   a grounding cable that removably couples to the conductive portion;
   a power supply that is configured to generate power and that is in electrical communication with the receptacle to communicate the power to the receptacle; and
   an annunciator that is in electrical communication with the power supply and the grounding cable and that is configured to generate a response when the receptacle, the multiphase plug, the conductive portion, and the grounding cable are in electrical communication to communicate the power therethrough.

2. The apparatus of claim 1, wherein the annunciator is configured to generate the response as a humanly perceivable response that includes at least one of light and sound.

3. The apparatus of claim 2, wherein the annunciator includes a light source that is configured to generate light as at least part of the response.

4. The apparatus of claim 2, wherein the annunciator includes a sound source that is configured to generate sound as at least part of the response.

5. The apparatus of claim 1, wherein the power is a direct current (DC) power.

6. The apparatus of claim 1, wherein the multiphase plug includes a ground terminal and active terminals, wherein the receptacle includes a ground outlet and active outlets, wherein the ground terminal removably couples to the ground outlet and the active terminals removably couple to the active outlets, and wherein the neutral conductor is electrically coupled to one of:
   the ground terminal; and
   one of the active terminals.

7. The apparatus of claim 6 wherein the power supply is configured to communicate the power to the ground outlet, and wherein the annunciator is configured to generate the response when the ground outlet, the ground terminal, the neutral conductor, the conductive portion, and the grounding cable are in electrical communication to communicate the power therethrough.

8. The apparatus of claim 7, wherein the apparatus includes a conductive terminal that is in electrical communication with the annunciator, wherein the grounding cable is configured to removably couple to the conductive terminal when electrically isolated from the conductive portion of the device, and wherein the annunciator is further configured to generate an additional response when the grounding cable is coupled to the conductive terminal to indicate that the power supply is generating the power.

9. The apparatus of claim 6 wherein the power supply is configured to communicate the power to the active outlets, and wherein the annunciator is configured to generate the response when one of the active outlets, one of the active terminals, the neutral conductor, the conductive portion, and the grounding cable are in electrical communication to communicate the power therethrough.

10. The apparatus of claim 9, wherein the apparatus includes a ground cable terminal that is in electrical communication with the annunciator, wherein the grounding cable has a first end portion that is electrically coupled to the ground cable terminal and a second end portion that is configured to removably couple to the ground cable terminal when electrically isolated from the conductive portion of the device, and wherein the annunciator is further configured to generate an additional response when the second end portion of the grounding cable is coupled to the ground cable terminal to indicate that the power supply is generating the power.

11. The apparatus of claim 1, wherein the apparatus includes a container that has a base portion and walls extending therefrom to at least partially surround a cavity, and wherein the receptacle, the grounding cable, the power supply, and the annunciator are disposed in the cavity.

12. The apparatus of claim 11, wherein the container is manually portable and includes a plurality of wheels coupled to the base portion and a handle coupled to one of the walls.

13. The apparatus of claim 1, wherein the multiphase plug is a 3-phase plug.

14. An apparatus for testing electrical wiring of a device having a conductive portion, an electrical component, and a multiphase plug that includes a ground terminal and active terminals and that is electrically coupled to a neutral conductor and at least two phase conductors, wherein the neutral conductor is coupled to the conductive portion and the at least two phase conductors are coupled to the electrical component, the apparatus comprising:
- a receptacle that includes a ground outlet and active outlets, wherein the ground outlet removably couples to the ground terminal and the active outlets removably couple to the active terminals, wherein the neutral conductor is electrically coupled to one of:
  - the ground terminal; and
  - one of the active terminals;
- a grounding cable that removably couples to the conductive portion;
- a first circuit section comprising:
  - a first power supply that is configured to generate a first power and that is in electrical communication with the receptacle to communicate the first power to the ground outlet; and
  - a first annunciator that is in electrical communication with the first power supply and the grounding cable and that is configured to generate a first response when the ground outlet, the ground terminal, the neutral conductor, the conductive portion, and the grounding cable are in electrical communication to communicate the first power therethrough; and
- a second circuit section comprising:
  - a second power supply that is configured to generate a second power and that is in electrical communication with the receptacle to communicate the second power to the active outlets; and
  - a second annunciator that is in electrical communication with the second power supply and the grounding cable and that is configured to generate a second response when one of the active outlets, a corresponding one of the active terminals, the neutral conductor, the conductive portion, and the grounding cable are in electrical communication to communicate the second power therethrough.

15. The apparatus of claim 14, wherein the apparatus includes a ground cable terminal that is in electrical communication with the second annunciator, wherein the grounding cable has a first end portion that is electrically coupled to the ground cable terminal and a second end portion that is configured to removably couple to the ground cable terminal when electrically isolated from the conductive portion of the device, and wherein the second annunciator is further configured to generate an additional second response when the second end portion of the grounding cable is coupled to the ground cable terminal to indicate that the second power supply is generating the second power.

16. The apparatus of claim 15, wherein the apparatus includes a conductive terminal that is in electrical communication with the first annunciator, wherein the second end portion of the grounding cable is configured to removably couple to the conductive terminal when electrically isolated from the conductive portion of the device, and wherein the first annunciator is further configured to generate an additional first response when the second end portion of the grounding cable is coupled to the conductive terminal to indicate that the first power supply is generating the first power.

17. The apparatus of claim 14, wherein the first circuit section includes the first annunciator that is configured to move between a first position and a second position, wherein when the first annunciator is in the first position, the first power is prevented from being communicated from the first power supply to the ground outlet, and wherein when the first annunciator is in the second position, the first power is communicated from the first power supply to the ground outlet.

18. The apparatus of claim 17, wherein the second circuit section includes the second annunciator that moves between a third position and a fourth position, wherein when the second annunciator is in the third position, the second power is communicated from the second power supply to the active outlets, and wherein when the second annunciator is in the fourth position, the second power is prevented from being communicated from the second power supply to the active outlets.

19. A method for testing electrical wiring of a device having a conductive portion, an electrical component, and a multiphase plug that is electrically coupled to a neutral conductor and at least two phase conductors, wherein the neutral conductor is coupled to the conductive portion and the at least two phase conductors are coupled to the electrical component, the method comprising the steps of:
- removably coupling a receptacle to the multiphase plug, wherein the receptacle is electrically coupled to a power supply that is electrically coupled to an annunciator;
- removably coupling a grounding cable to the conductive portion, wherein the grounding cable is electrically coupled to the annunciator;
- communicating power from the power supply to the receptacle; and
- generating a response from the annunciator when the receptacle, the multiphase plug, the conductive portion, and the grounding cable are in electrical communication to communicate the power therethrough.

20. The method of claim 19, wherein the multiphase plug includes a ground terminal and active terminals, wherein the receptacle includes a ground outlet and active outlets, wherein removably coupling the receptacle to the multiphase plug includes removably coupling the ground terminal to the ground outlet, and removably coupling the active terminals to the active outlets, and wherein the method further comprises the step of:
- communicating the power to one of the ground outlet and the active outlets, and wherein generating the response includes generating the response from the annunciator when one of:
  - the ground outlet, the ground terminal, the neutral conductor, the conductive portion, and the grounding cable are in electrical communication to communicate the power therethrough; and
  - one of the active outlets, one of the active terminals, the neutral conductor, the conductive portion, and the grounding cable are in electrical communication to communicate the power therethrough.

\* \* \* \* \*